(12) United States Patent
Fujikawa et al.

(10) Patent No.: US 8,961,802 B2
(45) Date of Patent: Feb. 24, 2015

(54) METHOD OF FORMING FINE PATTERN, AND DEVELOPER

(71) Applicants: Riken, Wako-shi (JP); Tokyo Ohka Kogyo Co., Ltd., Kawasaki-shi (JP)

(72) Inventors: Shigenori Fujikawa, Wako (JP); Harumi Hayakawa, Wako (JP); Takahiro Senzaki, Kawasaki (JP); Ken Miyagi, Kawasaki (JP)

(73) Assignees: Tokyo Ohka Kogyo Co., Ltd., Kawasaki-shi (JP); Riken, Wako-shi (JP)

( * ) Notice: Subject to any disclaimer, the term of this patent is extended or adjusted under 35 U.S.C. 154(b) by 0 days.

(21) Appl. No.: 13/927,464

(22) Filed: Jun. 26, 2013

(65) Prior Publication Data
US 2014/0054265 A1   Feb. 27, 2014

(30) Foreign Application Priority Data
Jun. 28, 2012  (JP) .................................. 2012-145474

(51) Int. Cl.
| | | |
|---|---|---|
| *B81C 1/00* | (2006.01) | |
| *H01L 21/033* | (2006.01) | |
| *H01L 21/308* | (2006.01) | |
| *H01L 21/311* | (2006.01) | |

(52) U.S. Cl.
CPC ......... *B81C 1/00531* (2013.01); *B81C 1/00031* (2013.01); *H01L 21/0337* (2013.01); *H01L 21/3086* (2013.01); *H01L 21/31133* (2013.01); *B81C 2201/0198* (2013.01); *B81C 2201/0149* (2013.01)
USPC ................ 216/48; 216/49; 430/436; 430/447

(58) Field of Classification Search
None
See application file for complete search history.

(56) References Cited

U.S. PATENT DOCUMENTS

| | | | | |
|---|---|---|---|---|
| 4,777,119 | A | * 10/1988 | Brault et al. | .................. 430/296 |
| 5,976,703 | A | * 11/1999 | Nakata et al. | ................. 428/447 |
| 6,565,763 | B1 | 5/2003 | Asakawa et al. | |
| 2007/0196776 | A1 * | 8/2007 | Huang et al. | .................. 430/401 |
| 2013/0210231 | A1 * | 8/2013 | Senzaki et al. | ................ 438/694 |
| 2013/0313223 | A1 * | 11/2013 | Fujikawa et al. | ............... 216/13 |

FOREIGN PATENT DOCUMENTS

| | | |
|---|---|---|
| JP | A-2008-036491 | 2/2008 |
| JP | B-4127682 | 7/2008 |

OTHER PUBLICATIONS

Hinsberg et al., "Self-Assembling Materials for Lithographic Patterning: Overview, Status and Moving Forward," Proceedings of SPIE, vol. 7637, 7370G-1, 2010.
Polymer Handbook, Fourth Edition, Edited by Brandrup et al., 1999, John Wiley & Sons, Inc., pp. 679-680.

* cited by examiner

*Primary Examiner* — Allan Olsen
(74) *Attorney, Agent, or Firm* — Knobbe Martens Olson & Bear LLP

(57) ABSTRACT

A method of forming a fine pattern, including: a phase separation step in which a layer containing a block copolymer having a plurality of blocks bonded is formed on a substrate, and then the layer is heated for phase separation of the layer; a decomposition step in which at least a portion of a phase of at least one block of the plurality of blocks constituting the block copolymer is decomposed; a selective removal step in which the layer is immersed in a developing solution to selectively remove a phase containing decomposed blocks to form a nano structure; and an etching step in which the substrate is subjected to etching by using the nano structure as a mask; and a main component of the developing solution is an organic solvent having an SP value of 7.5 to 11.5 $(cal/cm^3)^{1/2}$, and having vapor pressure of less than 2.1 kPa at 25° C., or is benzene that may be substituted by an alkyl group, an alkoxy group, or a halogen atom, and the developing solution further contains metal alkoxide.

16 Claims, No Drawings

METHOD OF FORMING FINE PATTERN, AND DEVELOPER

BACKGROUND OF THE INVENTION

1. Field of the Invention

The present invention is related to a method of forming a fine pattern by using phase separation of a block copolymer, and to a developing solution that can be used in the method.

This application claims priority to Japanese Patent Application No. 2012-145474 filed on Jun. 28, 2012, and the content of which is incorporated herein by reference.

2. Description of Related Art

Recently, as further miniaturization of large scale integrated circuits (LSI) proceeds, technology for forming an even finer pattern is demanded. In response to such demand, a method has been disclosed in which a fine pattern is formed using a phase-separated structure formed by self-assembly of a block copolymer having mutually incompatible blocks bonded together (see, for example, Patent Document 1).

For using a phase separation of a block copolymer, it is necessary to form a self-organized nano structure by a microphase separation only in specific regions, and arrange the nano structure in a desired direction. For realizing position control and orientation control, graphoepitaxy to control phase-separated pattern by a guide pattern and chemical epitaxy to control phase-separated pattern by difference in the chemical state of the substrate are proposed (see, for example, Non-Patent Document 1).

Methods for selectively removing a specific block region from a nano phase separated structure of a block copolymer are classified mainly into a liquid phase-type method and a dry-type method (see, for example, Non-Patent Document 2). The dry-type method (dry etching) is a method in which a reactive gas is blown on the nanophase-separated structure, and selective removal is conducted by using the difference in the decomposition rate of the polymers by the dry gas. On the other hand, the liquid phase-type method (liquid etching) is a method in which a block in a specific block region of the nanophase-separated structure is selectively decomposed if desired, followed by immersing the nanophase-separated structure in a developing solution, so as to preferentially dissolve and remove a specific phase portion. In the liquid etching, developing solutions based on aqueous solutions have generally been used, because materials thought to be formed by decomposition of the block is highly soluble to aqueous solutions.

Nano structures formed by using phase separation of the block copolymer as described above have been widely used as masks for conducting etching of supports (substrates). Usually, dry etching which uses reactive gas is applied for etching of supports.

PATENT DOCUMENT

[Patent Document 1]
Japanese Unexamined Patent Application, First Publication No. 2008-36491
[Patent Document 2]
Japanese Patent (Granted) Publication No. 4,127,682

NON-PATENT DOCUMENTS

[Non-Patent Document 1]
Proceedings of SPIE (U.S.), vol. 7637, pp. 76730G-1 (2010)

SUMMARY OF THE INVENTION

When dry etching is used to selectively remove a specific block region of a block copolymer, a surface of a block region, whose decomposition rate of a block by dry gas is slower, also tends to be decomposed and removed. Accordingly, a nano phase separated structure is hard to be accurately reflected in an obtained nano pattern, particularly in a height direction thereof. In addition, because dry etching is usually conducted under vacuum, a sequential process is difficult to be realized, and also the process becomes expensive for equipment required for vacuum and introduction of reactive gas.

On the other hand, when liquid etching is used to selectively remove a specific block region of a block copolymer, such expensive equipment is not required. However, since the surface tension of water is extremely high, when an aqueous developing solution is used, there is a possibility that a nano structure (nano pattern) formed in steps for manipulating etching and drying after the etching is disintegrated.

Also, when etching of a substrate is conducted by using a nano structure, which is formed by phase separation of a block copolymer, as a mask, the nano structure is required to have etching resistance for etching gas and the like. However, since such a nano structure is formed with specific blocks being retained after phase separation of a block copolymer, it has been difficult to select a material of the block copolymer, which has a structure allowing sufficient phase separation, as well as by which an obtained nano structure has sufficient etching resistance.

Accordingly, a method which realizes both sufficient etching resistance and sufficient phase separation has been needed.

The present invention takes the above circumstances into consideration, with an object of providing a method of forming a fine pattern having sufficient etching resistance by using phase separation of a block copolymer, and a developing solution that can be used in the method.

In order to solve the above-mentioned problems, the present invention employs the following aspects.

Specifically, a first aspect of the present invention is a method of forming a fine pattern, including: a phase separation step in which a layer containing a block copolymer having a plurality of blocks bonded is formed on a substrate, and then the layer is heated for phase separation of the layer; a decomposition step in which at least a portion of a phase of at least one block of the plurality of blocks constituting the block copolymer in the layer described above is decomposed; a selective removal step in which the layer is immersed in a developing solution to selectively remove a phase containing blocks decomposed in the decomposition step to form a nano structure; and an etching step in which the substrate is subjected to etching by using the nano structure as a mask; and a main component of the aforementioned developing solution is an organic solvent having an SP value of 7.5 to 11.5 (cal/cm$^3$)$^{1/2}$, and having vapor pressure of less than 2.1 kPa at 25° C., or is benzene that may be substituted by an alkyl group, an alkoxy group, or a halogen atom, and the developing solution further contains metal alkoxide.

A second aspect of the present invention is a developing solution used in a selective removal step of a method of forming a fine pattern, including: a phase separation step in which a layer containing a block copolymer having a plurality of blocks bonded is formed on a substrate, and then the layer is heated for phase separation of the layer; a decomposition step in which at least a portion of a phase of at least one block of the plurality of blocks constituting the block copolymer in the layer described above is decomposed; a selective removal step in which the layer is immersed in a developing solution to selectively remove a phase containing blocks decomposed in the decomposition step to form a nano structure; and an etching step in which the substrate is subjected to etching by using the nano structure as a mask; and a main component of the developing solution is an organic solvent having an SP value of 7.5 to 11.5 $(cal/cm^3)^{1/2}$, and having vapor pressure of less than 2.1 kPa at 25° C., or is benzene that may be substituted by an alkyl group, an alkoxy group, or a halogen atom, and the developing solution further contains metal alkoxide.

According to the present invention, a method of forming a fine pattern having sufficient etching resistance by using phase separation of a block copolymer, and a developing solution that can be used in the method can be provided.

DETAILED DESCRIPTION OF THE INVENTION

In the first aspect of the present invention, the method of manufacturing a substrate whose surface has a nano structure, includes a phase separation step in which a layer containing a block copolymer having a plurality of blocks bonded is formed on a substrate, and then the layer is heated for phase separation of the layer; a decomposition step in which at least a portion of a phase of at least one block of the plurality of blocks constituting the block copolymer in the layer described above is decomposed; a selective removal step in which the layer is immersed in a developing solution to selectively remove a phase containing blocks decomposed in the decomposition step to form a nano structure; and an etching step in which the substrate is subjected to etching by using the nano structure as a mask; and a main component of the aforementioned developing solution is an organic solvent having an SP value of 7.5 to 11.5 $(cal/cm^3)^{1/2}$, and having vapor pressure of less than 2.1 kPa at 25° C., or is benzene that may be substituted by an alkyl group, an alkoxy group, or a halogen atom, and the developing solution further contains metal alkoxide.

The layer containing a block copolymer having a plurality of blocks bonded forms a structure in which each of components constituting the block polymer is separated by phase separation. In the present invention, firstly, one or more phases in the phase separated structure are selectively removed by phase separation so that at least one phase in the phase separated structure is remained, and thereby a nano structure with the remained phase(s) can be formed on a substrate. Also, by adjusting the size and shape of the phase separated structure formed on the substrate, a nano structure having a desired size and shape can be formed on the substrate. Thus, by conducting etching of the substrate with the nano structure as a mask, a fine pattern can be formed on the substrate.

In the present invention, by using an organic solvent having an SP value (solubility parameter) in a specific range as a main component of the developing solution used for liquid etching, a specific phase in the nano phase separated structure can be selectively removed without disintegration of a pattern. Also, since the vapor pressure at 25° C. of the organic solvent that is a main component of the developing solution is less than 2.1 kPa, local volatilization of the organic solvent in the developing solution can be suppressed at the time of puddle development, which has been used in a conventional lithography process, and thereby a pattern having sufficient surface uniformity can be obtained. In addition, among organic solvents which have been widely used in semiconductor processes, the present invention utilizes an organic solvent having an SP value and vapor pressure within the range described above, and thus an easy and mass productive patterning process can be realized.

Also, in the present invention, by using benzene that may be substituted by an alkyl group, an alkoxy group, or a halogen atom as a main component of a developing solution used in liquid etching, a specific phase in the nano phase separated structure can be selectively removed without disintegration of a pattern. In addition, among organic solvents which have been widely used in semiconductor processes, the present invention utilizes an organic solvent whose main component is a compound having a specific structure, and thus an easy and mass productive patterning process can be realized.

Moreover, in the present invention, the developing solution used in liquid etching contains metal alkoxide, and thereby etching resistance can be given to a nano phase separated structure, which is for conducting etching of a substrate in the later etching step.

Hereafter, each of the steps and the materials used will be explained in detail.

[Phase Separation Step]

In the phase separation step, a layer containing a block copolymer having a plurality of blocks bonded is formed on a substrate, and then the layer is heated for phase separation of the layer.

The substrate is not particularly limited, as long as the substrate is not dissolved or mixed when it is coated with a undercoat agent or a block copolymer, and conventional substrates known to be used for electronic parts can be used.

Examples include a metal substrate containing metals such as a silicon wafer, gold, copper, chromium, iron, aluminum or the like; an oxidized metal substrate produced by oxidizing the metal; a glass substrate; and a polymer film (polyethylene, polyethylene terephthalate, polyimide, benzocyclobutene and the like).

Further, the size and the shape of the substrate are not particularly limited. The substrate does not necessarily need to have a smooth surface, and a substrate made of various materials and having various shapes can be appropriately selected for use. For example, a multitude of shapes can be used, such as a substrate having a curved surface, a plate having an uneven surface, and a thin sheet.

An inorganic and/or organic film may be provided on the surface of the substrate as described above, and preferably an organic film is provided on the surface of the substrate. As an inorganic film, an inorganic antireflection film (inorganic BARC) can be used. As an organic film, an organic antireflection film (organic BARC) can be used.

The inorganic film can be formed by, for example, coating the substrate with an inorganic antireflection film composition such as a silicon material, and then subjected to baking and the like.

The organic film can be formed by, for example, coating the substrate with an organic film-forming material, in which a resin component or the like constituting the film is dissolved in an organic solvent, by using a spinner or the like, and then subjected to a baking treatment with a heating condition of preferably 200 to 300° C., preferably for 30 to 300 seconds, and more preferably for 60 to 180 seconds. Unlike resist films, the organic film-forming material used at this time is not necessarily susceptible to light and/or electron beams, and the organic film-forming material may or may not have such susceptibility. Specifically, resists and resins usually used for manufacturing semiconductor elements and liquid crystal display elements can be used.

In addition, in the etching step which will be explained below, etching is conducted to the organic film by using a pattern of the block copolymer so that the pattern is transferred to the organic film to form an organic film pattern, and thus the organic film-forming material can preferably form organic films which can be used for etching, especially dry etching. In particular, the organic film-forming material can preferably form organic films which can be used for etching, such as oxygen plasma etching. Such the organic film-forming material may be a material conventionally used to form organic films such as organic BARC. Examples include the ARC series manufactured by Brewer Science, Inc., the AR series manufactured by Rohm and Haas Company, the SWK series manufactured by Tokyo Ohka Kogyo Co., Ltd., and the like.

The surface of the substrate may be washed in advance. By washing the surface of the substrate, the subsequent neutralization reaction treatment may be satisfactorily performed.

As the washing treatment, a conventional method may be used, and examples thereof include an oxygen plasma treatment, an ozone oxidation treatment, an acid alkali treatment, a chemical modification treatment, and the like.

Also, a layer containing a undercoat agent (neutralization film) is preferably formed by previously coating the surface of the substrate with the undercoat agent (neutralization treatment). The neutralization film refers to a film which modifies the surface of the substrate to have affinity for all polymers constituting the block copolymer.

A method of forming the layer containing the undercoat agent by coating the substrate with the undercoat agent is not particularly limited, and the layer can be formed by employing a conventional method.

For example, the layer containing the undercoat agent can be formed by coating the substrate with the undercoat agent by employing a conventional method such as spin coat or a spinner so that a coated film is formed, and then the coated film is dried. The undercoat agent will be explained later in detail.

By employing a method of drying the coated film, an organic solvent contained in the undercoat agent may be volatilized, and an example of the method is a baking method.

The temperature of baking is preferably from 80 to 300° C., more preferably from 100 to 270° C., and still more preferably from 120 to 250° C. The time of baking is preferably from 30 to 500 seconds, and more preferably from 60 to 240 seconds.

By providing the layer containing the undercoat agent on a surface of the substrate, the surface of the substrate becomes neutralized, and in a layer of the block copolymer provided as an upper layer of the layer containing the undercoat agent, a phase of specific blocks can be exclusively suppressed to contact with the surface of the substrate. As a result, by phase separation of the layer containing the block copolymer, a cylinder structure, a dot structure, a gyroid structure and the like, which are freely oriented to the surface of the substrate, can be formed.

(Undercoat Agent)

Although the undercoat agent is not particularly limited, as long as it has affinity for any of a plurality of blocks constituting the layer of the block copolymer, and has the effect described above, a film composed of a resin composition may be used.

The resin composition used as the undercoat agent can be appropriately selected from conventional resin compositions used for forming a thin film, depending on the type of blocks constituting the block copolymer. The resin composition used as the undercoat agent may be a heat-polymerizable resin composition, or a photosensitive resin composition. It may also be a composition which can be used to form patterns, such as a positive resist composition or a negative resist composition.

Alternatively, the layer containing the undercoat agent may be a non-polymerizable film. For example, a siloxane organic monomolecular film such as phenethyltrichlorosilane, octa-decyltrichlorosilane or hexamethyldisilazane may be preferably used as the neutralization film.

Examples of the undercoat agent include a composition containing resin which contains all structural units of the blocks constituting the block copolymer, and a composition containing resin which contains all structural units having high affinity for the blocks constituting the block copolymer. For example, when a PS-PMMA block copolymer is used, as a resin contained in the undercoat agent, it is preferable to use a resin containing both a structural unit derived from styrene and a structural unit derived from methyl methacrylate; a resin containing both a portion having a high affinity for PS such as an aromatic ring and a portion having a high affinity for PMMA such as a functional group with high polarity; or the like.

Examples of the resin containing both a structural unit derived from styrene and a structural unit derived from methyl methacrylate include a random copolymer obtained by randomly polymerizing styrene and methyl methacrylate.

Examples of the resin containing both a portion having a high affinity for PS and a portion having a high affinity for PMMA include a resin obtained by polymerizing at least a monomer having an aromatic ring and a monomer having a substituent with high polarity.

Examples of the monomer having an aromatic ring include a monomer having a group in which one hydrogen atom has been removed from the ring of an aromatic hydrocarbon, such as a phenyl group, a biphenyl group, a fluorenyl group, a naphthyl group, an anthryl group or a phenanthryl group, or a monomer having a hetero aryl group such as the aforementioned group in which part of the carbon atoms constituting the ring of the group has been substituted with a hetero atom such as an oxygen atom, a sulfur atom or a nitrogen atom.

Examples of the monomer having a substituent with high polarity include a monomer having a trimethoxysilyl group, a trichlorosilyl group, a carboxy group, a hydroxy group, a cyano group, an amino group or a hydroxyalkyl group in which part of the hydrogen atoms of the alkyl group has been substituted with fluorine atoms.

Examples of the compound containing both a portion having a high affinity for PS and a portion having a high affinity for PMMA include a compound having both an aryl group such as a phenethyltrichlorosilane and a substituent with high polarity, and a compound having both an alkyl group and a substituent with high polarity, such as an alkylsilane compound.

Prior to forming the layer of the block copolymer, a guide pattern having a pattern formed may be previously provided on the substrate, or on the substrate having the layer containing the undercoat agent. According to this, an arrangement structure of the phase separated structure can be controlled depending on the shape and surface properties of the guide pattern. For example, even if the block copolymer forms a random, fingerprint-like phase separated structure without a guide pattern, by introducing a groove structure of a resist film onto the surface of the substrate, a phase separated structure oriented along the groove structure can be obtained. As the guide pattern, for example, a structure having a physical configuration such as an L/S pattern or a contact hole pattern can be used.

Also, when the surface of the guide pattern is provided with affinity for any of the polymers constituting the block copolymer, a phase separated structure having a lamellar structure or a cylinder structure, which is oriented in the direction vertical to the surface of the substrate, may easily be formed.

Specifically, for example, a resist composition is applied to a surface of a substrate using a spinner or the like, and a prebake (post applied bake (PAB)) is conducted under temperature conditions of 80 to 150° C. for 40 to 120 seconds, preferably 60 to 90 seconds to form a resist film. Then, for example, using an ArF exposure apparatus or the like, the resist film is selectively exposed to an ArF excimer laser beam through a desired mask pattern, followed by post exposure bake (PEB) under temperature conditions of 80 to 150° C. for 40 to 120 seconds, preferably 60 to 90 seconds. Subsequently, developing is conducted using an alkali developing solution such as a 0.1 to 10% by weight aqueous solution of tetramethylammonium hydroxide (TMAH), preferably followed by rinsing with pure water, and drying. If desired, a bake treatment (post bake) can be conducted following development. In this manner, a guide pattern that is faithful to the mask pattern can be formed.

The height of the guide pattern from the surface of the substrate (or from the surface of the neutralization film) is preferably greater than or equal to the thickness of the layer containing the block copolymer, which is formed on the surface of the substrate. A height of the guide pattern from the surface of the substrate (or from the surface of the neutralization film) can be suitably adjusted by, for example, a film thickness of the resist film formed by coating with a resist composition forming the guide pattern.

The resist composition for forming the guide pattern can be appropriately selected from resist compositions or a modified product thereof typically used for forming a resist pattern which have affinity for any of the polymers constituting the block copolymer. Examples of the resist composition include a resist composition which generates acid upon exposure, and the solubility to a developing solution is altered by the action of the acid. Although the resist composition can be either a positive resist composition in which an exposed portion is dissolved and removed to form a positive pattern or a negative resist composition in which an unexposed portion is dissolved and removed to form a negative pattern, a negative resist composition is preferable. As the negative resist composition, for example, a resist composition containing an acid generator and a undercoat agent component, in which solubility of the undercoat agent component to a developing solution containing an organic solvent is decreased by action of the acid, and the undercoat agent component contains a resin component having a structural unit decomposed upon action of the acid to increase polarity, is preferable.

When a solution of the block copolymer is cast onto the surface of the substrate having a guide pattern formed, a heat treatment is conducted to cause a phase separation. Therefore, the resist pattern for forming a guide pattern is preferably capable of forming a resist film which exhibits solvent resistance and heat resistance.

A method of forming a layer, which contains a block copolymer having a plurality of blocks bonded, on the layer containing the undercoat agent described above is not particularly limited, and for example, it can be formed by coating the layer containing the undercoat agent with a composition containing a block copolymer. Examples of a method of coating include the same as those for the undercoat agent.

In the present invention, the thickness of the layer containing the block copolymer can be a thickness sufficient for a phase separation to occur, and although the lower limit of the thickness is not limited, it is preferably 5 nm or above, and more preferably 10 nm or above when taking into consideration of the periodic structure size of the phase-separated structure to be formed, uniformity of the nano structure, and the like.

(Composition Containing Block Copolymer)
Block Copolymer

In the present invention, the block copolymer refers to a polymeric material in which a plurality of partial structural components (blocks) are bonded, and in the block, only identical types of structural units are bonded. As the blocks constituting the block copolymer, 2 types of blocks may be used, or 3 or more types of blocks may be used. In the present invention, the plurality of blocks constituting the block copolymer are not particularly limited, as long as they are combinations capable of causing phase separation. However, it is preferable to use a combination of blocks which are mutually incompatible. Further, it is preferable that a phase of at least one block of the plurality of blocks constituting the block copolymer can be easily subjected to selective removal as compared to the phases of other blocks.

Examples of the block copolymer include a block copolymer having a block of a structural unit derived from styrene or a derivative thereof bonded to a block of a structural unit derived from an ($\alpha$-substituted)acrylate ester; a block copolymer having a block of a structural unit derived from styrene or a derivative thereof bonded to a block of a structural unit derived from a siloxane or a derivative thereof; and a block copolymer having a block of a structural unit derived from an alkylene oxide bonded to a block of a structural unit derived from an ($\alpha$-substituted)acrylate ester.

Here, the term "($\alpha$-substituted)" refers to that a hydrogen atom bonded to a carbon atom at the [$\alpha$]-position may or may not be substituted by a substituent.

Examples of a structural unit derived from styrene or a derivative thereof and a structural unit derived from an ($\alpha$-substituted)acrylate ester include the same as those described above.

Examples of the siloxane derivative include dimethylsiloxane, diethylsiloxane, diphenylsiloxane, methylphenylsiloxane and the like.

Examples of the alkylene oxide include ethylene oxide, propylene oxide, isopropylene oxide, butylene oxide and the like.

Among them, a block copolymer having a block of a structural unit derived from styrene or a derivative thereof bonded to a block of a structural unit derived from a (meth)acrylate ester is preferably used as the block copolymer.

Specific examples thereof include a polystyrene-polymethyl methacrylate (PS-PMMA) block copolymer, a polystyrene-polyethyl methacrylate block copolymer, a polystyrene-(poly-t-butyl methacrylate) block copolymer, a polystyrene-polymethacrylic acid block copolymer, a polystyrene-polymethyl acrylate block copolymer, a polystyrene-polyethyl acrylate block copolymer, a polystyrene-(poly-t-butyl acrylate) block copolymer, and a polystyrene-polyacrylic acid block copolymer, and it is particularly preferable to use a PS-PMMA block copolymer.

The weight average molecular weight (Mw) (the polystyrene equivalent value determined by gel permeation chromatography) of each polymer constituting the block copolymer is not particularly limited as long as it is large enough to cause phase separation. The weight average molecular weight is preferably 5,000 to 500,000, more preferably 5,000 to 400,000, and still more preferably 5,000 to 300,000.

The polydispersity (Mw/Mn) of the block copolymer is preferably 1.0 to 3.0, more preferably 1.0 to 1.5, and still more preferably 1.0 to 1.2. Here, Mn is the number average molecular weight.

Hereafter, among the blocks constituting the block copolymer, a block which is not selectively removed in the later step is referred to as "block $P_A$", and a block to be selectively removed is referred to as "block $P_B$". For example, after the phase separation of a layer containing a PS-PMMA block copolymer, by subjecting the layer to a decomposition treatment and a developing solution treatment, the phase of PMMA is selectively removed. In such a case, PS is the block $P_A$, and PMMA is the block $P_B$.

In the present invention, a shape and a size of a phase selectively removed (i.e., a phase composed of a $P_B$ block) is defined by the compositional ratio of each block constituting the block copolymer and the molecular weight of the block copolymer. For example, by adjusting the compositional ratio by volume of the $P_B$ block in the block copolymer relatively small, a cylinder structure in which a phase of the $P_B$ block cylindrically exists in a phase of the $P_A$ block can be formed. Also, by adjusting the compositional ratio by volume between the $P_B$ block and the $P_A$ block in the block copolymer comparable, a lamellar structure in which a phase of the $P_A$ block and a phase of the $P_B$ block are laminated alternately can be formed. In addition, by increasing the molecular weight of the block copolymer, a size of each of the phases can be increased.

In addition to the block copolymer described above, miscible additives, for example, an additional resin for improving the quality of the layer containing the undercoat agent, a surfactant for increasing coat-ability, a dissolution inhibitor, a plasticizer, a stabilizer, a coloring agent, a halation preventing agent, a dyestuff, a sensitizer, a base proliferating agent, a basic compound and the like can be suitably added to the composition containing the block copolymer as desired.

Organic Solvent

The composition containing the block copolymer can be prepared by dissolving the block copolymer described above in an organic solvent.

As the organic solvent for dissolving the block copolymer, any organic solvent which is capable of dissolving the block copolymer to be used and forming a uniform solution can be used, and an organic solvent having high compatibility with all of the polymers constituting the block copolymer can be used. As the organic solvent, one type of solvent can be used, or two or more types may be used in combination.

Examples of the organic solvent for dissolving the block copolymer include lactones such as γ-butyrolactone; ketones such as acetone, methyl ethyl ketone, cyclohexanone, methyl-n-pentyl ketone, methyl isopentyl ketone, and 2-heptanone; polyhydric alcohols, such as ethylene glycol, diethylene glycol, propylene glycol and dipropylene glycol; compounds having an ester bond, such as ethylene glycol monoacetate, diethylene glycol monoacetate, propylene glycol monoacetate, and dipropylene glycol monoacetate; polyhydric alcohol derivatives including compounds having an ether bond, such as a monoalkylether (e.g., monomethylether, monoethylether, monopropylether or monobutylether) or monophenylether of any of these polyhydric alcohols or compounds having an ester bond (among these, propylene glycol monomethyl ether acetate (PGMEA) and propylene glycol monomethyl ether (PGME) are preferable); cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethylbenzylether, cresylmethylether, diphenylether, dibenzylether, phenetole, butylphenylether, ethylbenzene, diethylbenzene, pentylbenzene, isopropylbenzene, toluene, xylene, cymene and mesitylene.

For example, when a PS-PMMA block copolymer is used as the block copolymer, it is preferably dissolved in toluene, butyl acetate, 2-heptanone or PGMEA, more preferably dissolved in toluene, 2-heptanone, or PGMEA, and particularly preferably dissolved in 2-heptanone or PGMEA.

An amount for use of the organic solvent in the composition containing the block copolymer is not particularly limited, and the amount is suitably determined as a coatable concentration, depending on the thickness of the coated film. Usually, the amount is determined so that a solid concentration of the block copolymer is within a range from 0.2 to 70% by mass, preferably within a range from 0.2 to 50% by mass.

In phase separation of the layer containing the block copolymer, the substrate on which the layer containing the block copolymer is formed, or the substrate having the layer containing the undercoat agent is heat-treated, and the block copolymer is selectively removed in the later process, so that the phase separated structure in which at least a portion of the surface of either the substrate or the layer containing the undercoat agent on the substrate is exposed. The heat treatment is preferably conducted at a temperature at least as high as the glass transition temperature of the block copolymer used and lower than the heat decomposition temperature. For example, when the block copolymer used is a PS-PMMA (Mw: 40 k to 20 k), the heat treatment is preferably conducted at 180 to 270° C. for 30 to 3600 seconds.

Further, the heat treatment is preferably conducted in a low reactive gas such as nitrogen.

[Decomposition Step]

In the decomposition step, at least a portion of a phase of at least one block of the plurality of blocks constituting the block copolymer in the layer containing the block copolymer, which is formed in the previous step, is decomposed.

Among the layer containing the block copolymer formed on the substrate after forming the phase-separated structure, at least a portion of the polymer of the phase constituted of the block $P_B$ is decomposed (the molecular weight is decreased). By decomposing a portion of the block $P_B$ in advance, the solubility to a developing solution can be enhanced. As a result, the phase constituted of the block $P_B$ can be more reliably removed by selective removal than the phase constituted of the block $P_A$.

The decomposition treatment is not particularly limited, as long as it is a treatment capable of decomposing the block $P_B$ with priority to the block $P_A$. The decomposition treatment can be appropriately selected from any methods for decomposing polymers, depending on the types of the block $P_A$ and the block $P_B$. Examples of the decomposition treatment include an ultraviolet (UV) irradiation treatment, an ArF excimer laser treatment, a heat decomposition treatment, a chemical reaction treatment and the like.

In the present invention, the decomposition treatment is conducted preferably by a UV irradiation treatment. By the UV irradiation treatment, curing of the block $P_A$ can be promoted concurrently with decomposition of the block $P_B$. In the UV irradiation treatment, an amount of exposure to UV can suitably be adjusted depending on types of the block $P_A$ and the block $P_B$. When the amount of exposure to UV is too little, decomposition of the polymer $P_B$ tends to be insufficient, and the amount of exposure to UV is too large, even the block $P_A$ tends to be decomposed. For example, when a PS-PMMA block copolymer is used, the amount of exposure to UV is preferably from 1 to 100 mJ/cm$^2$, and more preferably from 10 to 50 mJ/cm$^2$, at a wavelength of 254 nm.

In the present invention, the decomposition treatment is conducted preferably also by an ArF excimer laser treatment. By the ArF excimer laser treatment, curing of the block $P_A$ can be promoted concurrently with decomposition of the block $P_B$. In the ArF excimer laser treatment, an amount of exposure to ArF can suitably be adjusted depending on types of the block $P_A$ and the block $P_B$. When the amount of exposure to ArF is too small, decomposition of the block $P_B$ tends to be insufficient, and the amount of exposure to ArF is too large, even the block $P_A$ tends to be decomposed. For example, the amount of exposure to ArF is preferably from 400 to 4000 mJ/cm$^2$, and more preferably from 800 to 3600 mJ/cm$^2$, at a wavelength of 193 nm.

[Selective Removal Step]

In the selective removal step, the layer containing the block copolymer, which is formed in the phase separation step described above, is immersed in a developing solution to selectively remove a phase containing blocks decomposed in the decomposition step to form a nano structure.

By conducting this step, only the phase of the block $P_A$ remains on the exposed surface of the substrate. That is, a nano structure whose surface has only the phase of the block $P_A$ is formed on the surface of the substrate. When the phase separated structure is a lamellar structure or a cylinder structure, which is oriented in the direction vertical to the surface of the substrate, a line-shaped or a hole-shaped nano structure, which has only the phase of the block $P_A$, is formed on the substrate by selectively removing the phase of the block $P_B$.

Among the phases of the block $P_B$, a phase sequentially formed from the surface of the substrate through the surface of the layer containing the block copolymer is removed by the selective removal, and the surface of the substrate is exposed. When a neutralization film is formed on the surface of the substrate in advance, the neutralization film is also removed together with the layer of the block $P_B$. On the other hand, when a guide pattern is formed on the surface of the substrate in advance, the guide pattern as well as the block $P_A$ are not removed.

In the present invention, the selective removal treatment is conducted by immersing a substrate after forming the phase-separated structure in a developing solution to selectively dissolve and remove the phase of the polymer $P_B$, in which a main component of the developing solution is an organic solvent having an SP value of 7.5 to 11.5 (cal/cm$^3$)$^{1/2}$, and having vapor pressure of less than 2.1 kPa at 25° C., or is benzene that may be substituted by an alkyl group, an alkoxy group, or a halogen atom.

When the developing solution whose main component is an organic solvent having an SP value of 7.5 to 11.5 (cal/cm$^3$)$^{1/2}$, and having vapor pressure of less than 2.1 kPa at 25° C. is used, the SP value of the organic solvent is preferably 8.0 to 10.5 (cal/cm$^3$)$^{1/2}$, and more preferably 8.4 to 9.5 (cal/cm$^3$)$^{1/2}$. Note that, in the present invention or in the present specification, the SP value refers to a value estimated with the theoretical formula described in the pages 679 to 680 of "POLYMER HANDBOOK (FOURTH EDITION)" (edited by Brandrup, et al., 1999, John Wiley & Sons, Inc.).

The developing solution may contain one type of, or two or more types of the organic solvent having an SP value of 7.5 to 11.5 (cal/cm$^3$)$^{1/2}$, and having vapor pressure of less than 2.1 kPa at 25° C. The developing solution may also contain components other than the organic solvent having an SP value of 7.5 to 11.5 (cal/cm$^3$)$^{1/2}$, and having vapor pressure of less than 2.1 kPa at 25° C., as long as the component(s) do not impair the effects of the present invention. Examples of other components include an organic solvent having vapor pressure greater than or equal to 2.1 kPa at 25° C., such as ethyl acetate.

In the present invention, butyl acetate, 2-heptanone or PGMEA is preferable as the organic solvent having an SP value and vapor pressure within the range described above. In addition, the developing solution preferably contains one or more selected from the group consisting of butyl acetate, 2-heptanone and PGMEA.

When the developing solution whose main component is benzene that may be substituted by an alkyl group, an alkoxy group, or a halogen atom is used, examples of the alkyl group include an alkyl group of 1 to 5 carbon atoms. Examples of the alkoxy group include an alkoxy group of 1 to 5 carbon atoms. Examples of the halogen atom include a fluorine atom, a chlorine atom and the like. The benzene which is a main component of the developing solution may be substituted by one of these substituents, or by two or more of the same or different types of these substituents, or the benzene may not have any substituents.

In the present invention, the benzene that may be substituted by an alkyl group, an alkoxy group, or a halogen atom is preferably benzene, toluene, ethyl benzene, xylene, anisole, or chlorobenzene, and more preferably toluene or benzene. Also, the developing solution preferably contains one or more selected from the group consisting of benzene, toluene, ethyl benzene, xylene, anisole and chlorobenzene.

Selectivity on the removal of the phase of the block $P_B$ by using the developing solution (degree of difficulty for removing the phase of the block $P_A$) and preservability of the nano structure (degree of correspondence between the nano structure formed by removing only the phase of the block $P_B$ exposed from the nano phase separated structure and the nano structure actually formed) may also depend on a types of the solvent used for dissolving the block copolymer. For example, when the solvent used for dissolving the block copolymer is toluene or PGMEA, a main component of the developing solution is preferably butyl acetate, 2-heptanone or PGMEA; or toluene or benzene.

The developing solution of the present invention contains metal alkoxide. The term "metal alkoxide" used herein refers to a compound having a metal atom and an alkoxy group.

The metal atom of the metal alkoxide may be a metal atom of a rare-earth metal, or a metal atom of a metal other than rare-earth metals.

Examples of metal alkoxide of a rare-earth metal include lanthanide isopropoxide (Ln(O-iPr)$_3$), yttrium isopropoxide (Y(O-iPr)$_3$) and the like.

Examples of metal alkoxide of a metal other than rare-earth metals include titanium butoxide (Ti(O-nBu)$_4$), zirconium propoxide(Zr(O-nPr)$_4$), aluminum butoxide (Al(O-nBu)$_3$), niobium butoxide (Nb(O-nBu)$_5$), silicon tetramethoxide (Si(O—Me)$_4$), boron ethoxide (B(O-Et)$_3$), hafnium butoxide (Hf(O-nBu)$_3$) and the like.

Metal alkoxide may have an organic group other than an alkoxy group. Examples of an organic group include an alkyl group, an amino group, an alkyl amino group, an isocyanate group, an ureido group and the like. Specific examples of metal alkoxide having such an organic group include 3-aminopropyltrimethoxysilane, N-(2-aminoethyl)-3-aminopropyltrimethoxysilane, 3-isocyanatepropyltriethoxysilane, 3-ureidopropyltrimethoxysilane and the like.

In addition, metal alkoxide may also be the one having another main backbone, and having a metal atom and an alkoxy group bonded to the metal atom as a substituent for the other backbone. A specific example thereof is tris-(3-trimethoxysilylpropyl)isocyanurate.

Microparticles of alkoxide sol or alkoxide gel, which can be obtained by adding a small amount of water to metal alkoxide described above to induce partial hydrolysis and condensation, can also be used.

Further, a binuclear or cluster type alkoxide compound having a plurality of or the plural types of metal elements, such as a titanium butoxide tetramer (C$_4$H$_9$O[Ti(OC$_4$H$_9$)$_2$ O]$_4$C$_4$H$_9$), and a macromolecule based on a metal alkoxide compound that is one-dimensionally cross-linked via an oxygen atom, and the like are also included in the metal alkoxides described above.

Among them, silicon alkoxide is preferable as metal alkoxide for its notably good etching resistance, and 3-aminopropyltrimethoxysilane is particularly preferable.

One type of metal alkoxide can be used, or two or more types may be used in combination.

In the present invention, since the developing solution contains metal alkoxide, the surface of the nano structure is modified by the metal alkoxide at the time of development, and thus etching resistance of the pattern is thought to be improved.

In the present invention, a heat treatment may preferably be conducted after the selective removal. By conducting a heat treatment, affinity between the nano structure formed and metal alkoxide is enhanced, and thereby etching resistance of the nano structure can further be improved. Although the time and temperature for the heat treatment are not particularly limited, it is preferably conducted at 150 to 40° C., preferably at 120 to 80° C., for 10 to 120 seconds.

[Etching Step]

In the etching step, the substrate is subjected to etching by using the nano structure as a mask.

In the previous step of the present invention, since etching resistance of the nano structure is improved by using metal alkoxide for the developing solution, a desired etching pattern can be obtained without impairing a structure of the nano structure, which becomes a mask during the etching.

Although a method of etching is not particularly limited, dry etching is preferable, and oxygen (O$_2$) plasma etching, or etching with CF$_4$ gas, CHF$_3$ gas, or Ar/CF$_4$ gas is more preferably used in terms of efficiency, and among them, oxygen plasma etching is most preferable.

A condition of dry etching is not particularly limited, and is suitably determined depending on a material of the nano structure and a height of the nano structure from the surface of the substrate. For example, when the oxygen plasma treatment is used, the pressure at the time of the oxygen plasma treatment is preferably from 1.33 to 66.5 Pa (10 to 50 mtorr), and more preferably from 13.3 to 26.6 Pa (100 to 200 mtorr). A plasma output at the time of the oxygen plasma treatment is preferably from 5 to 500 W, and more preferably from 5 to 50 W. A treatment time at the time of the oxygen plasma treatment is preferably from 1 to 100 seconds, and more preferably from 2 to 60 seconds. In addition, the temperature for the oxygen plasma treatment is preferably −30 to 300° C., more preferably at 0 to 100° C., and most preferably at room temperature (5 to 40° C.). A plasma device used for the oxygen plasma treatment is not particularly limited, and for example, the PE-2000 plasma etcher manufactured by South Bay Technology, USA, can be used.

The developing solution of the second aspect of the present invention is the same developing solution used in the method of the first aspect described above, and it follows the explanation for the first aspect.

EXAMPLES

As follows is a description of examples of the present invention, although the scope of the present invention is by no way limited by these examples.

Reference Example 1 and 2

After a silicon substrate was immersed in a sulfuric acid/ hydrogen peroxide water mixture (volume ratio 7:3) for 1 hour, the substrate was washed with water, and then air-dried with nitrogen gas. Next, after the substrate was immersed in a toluene solution of phenethyltrichlorosilane (1.0% by mass), the substrate was heated at 250° C. for 60 seconds, and finally immersed in toluene for 30 seconds, followed by air-drying with nitrogen gas.

The substrate was spin-coated (number of rotations: 3000 rpm, 60 seconds) with a toluene solution of PS polymer (molecular weight: 90000) (17.5 mg/ml) to form a film having a film thickness of 100 nm. Then, the substrate was heated at 200° C. for 1 hour under nitrogen airflow.

Next, a portion of the substrate was irradiated with UV for 15 minutes by using an ozoneless low pressure mercury lamp (254 nm) (manufactured by SEN LIGHT Co., Ltd.). An amount of UV for exposure was 18.0 mJ/cm$^2$.

Then each of the substrates were immersed in toluene not containing metal alkoxide for 20 seconds, and then air-dried with nitrogen gas.

After that, the substrate on which a PS film was formed was subjected to O$_2$ etching (10 sccm, 1.3 Pa, 50 W), and time-dependent decrease of the thickness of the PS film was measured to calculate the etching rate. The results are shown in Table 1.

TABLE 1

|  | UV | Etching Rate |
| --- | --- | --- |
| Reference Example 1 | None | 1.3 nm/second |
| Reference Example 2 | 15 minutes | 1.5 nm/second |

Example 1 to 7

After a silicon substrate was immersed in a sulfuric acid/ hydrogen peroxide water mixture (volume ratio 7:3) for 1 hour, the substrate was washed with water, and then air-dried with nitrogen gas. Next, after the substrate was immersed in a toluene solution of phenethyltrichlorosilane (1.0% by mass), the substrate was heated at 250° C. for 60 seconds, and finally immersed in toluene for 30 seconds, followed by air-drying with nitrogen gas.

The substrate was spin-coated (number of rotations: 3000 rpm, 60 seconds) with a toluene solution of PS-PMMA block copolymer 1 (molecular weight of PS: 53000, and molecular weight of PMMA: 54000; Poly dispersity index (PDI): 1.16) (17.5 mg/ml) to form a film having a film thickness of 150 to 200 nm. Then, after the substrate was heated at 110° C. for 90 seconds, the substrate on which the PS-PMMA block copolymer was coated was heated at 200° C. for 1 hour under nitrogen airflow to form the phase separated structure.

Next, the substrate was irradiated with UV by using an ozoneless low pressure mercury lamp (254 nm) (manufactured by SEN LIGHT Co., Ltd.). An amount of UV for exposure was 18.0 mJ/cm$^2$.

Then each of the substrates were immersed in toluene containing 1 mM metal alkoxide shown in Table 2 for 20 seconds, and then immersed in toluene for 20 seconds, followed by air-drying with nitrogen gas. According to that, the nano structure having only a phase of PS on the surface thereof was remained on the substrate. After that, in Example 4, heating at 100° C. was conducted for 30 minutes. Note that, the sequence from UV irradiation to air-drying with nitrogen gas, or to the heating treatment is referred to as the developing treatment.

The surface after the developing treatment was checked by using a scanning electron microscope.

The surface on which the nano structure, which reflects a phase separated structure, was observed was designated as "A," and is shown in Table 2. Comments regarding the surface shapes observed are also described in Table 2.

After that, the substrate on which the nano structure was formed was subjected to dry etching, and time required until the nano structure on the substrate was lost according to etching was determined. The $O_2$ etching was conducted at 10 sccm, 1.3 Pa, 50 W for 1, 2, or 3 minutes, and $CF_4$ etching was conducted at 40 sccm, 2 Pa, 100 w for 2 minutes. The results are shown in Table 2.

In addition, in Example 4, the $O_2$ etching rate of the PS portion measured was 0.2 nm/seconds.

ecule compound (A) [Mw=40000, Mw/Mn=1.75, l/m/n/o=88/6/3/3 (molar ratio)] by using a spinner, and the baking treatment was conducted at 250° C. for 300 seconds to form the layer containing the undercoat agent having a film thickness of 10 nm.

Next, the layer was rinsed with PGMEA for 10 seconds as spinning, and the baking treatment was conducted at 100° C. for 60 seconds.

Next, the substrate, on which the layer containing the undercoat agent was formed, was spin-coated (number of rotations: 3000 rpm, 60 seconds) with a toluene solution of the same PS-PMMA block copolymer 1 above (17.5 mg/ml).

TABLE 2

| | Metal Alkoxide | Development | Heating | $O_2$ etching | $CF_4$ etching | Comment |
|---|---|---|---|---|---|---|
| Example 1 | (1) | A | No | 1 min or less | 2 min or less | Relatively inferior surface shape |
| Example 2 | (2) | A | No | 1 min or less | None | — |
| Example 3 | (3) | A | No | 3 min or more | 2 min or less | Relatively inferior surface shape |
| Example 4 | (3) | A | Yes | 2 min | 2 min or more | Etching can be done as retaining phase separated structure |
| Example 5 | (4) | A | No | 1 min | 2 min or more | Etching can be done as retaining phase separated structure |
| Example 6 | (5) | A | No | 1 min or less | 2 min or more | Etching can be done as retaining phase separated structure |
| Example 7 | (6) | A | No | 1 min | 2 min or more | Etching can be done as retaining phase separated structure |

In Table 2, each abbreviation refers to the following.
(1): Tetraethoxysilane
(2): N-2-aminoethyl-3-aminopropyltrimethoxysilane
(3): 3-aminopropyltrimethoxysilane
(4): Tris(3-trimethoxysilylpropyl)isocyanurate
(5): 3-isocyanatepropyltriethoxysilane
(6): 3-ureidopropyltrimethoxysilane According to the results of above, it was confirmed that even when the developing solution containing metal alkoxide is used, preferable nano structures can be obtained without affecting the developing treatment.

Also according to the results of above, it was confirmed that when the developing solution containing metal alkoxide is used, sufficient etching resistance can be given to the nano structure. In addition, it was confirmed that the surface shape can be improved by conducting a heat treatment prior to the etching treatment.

Further, it was confirmed that when the method of the present invention was used, the etching rate was markedly decreased compared to when the developing solution of the aforementioned reference examples 1 and 2, which did not contain metal alkoxide, was used.

Comparative Example 1 and 2, Example 8 and 9

A silicon substrate was coated with an organic antireflection film composition "ARC-29A" (product name, manufactured by Brewer Science Ltd.) by using a spinner, and the composition was then baked and dried on a hot plate at 205° C. for 60 seconds, thereby forming an organic antireflection film having a thickness of 82 nm.

Next, the surface of the substrate was coated with a 0.4% by mass solution (solvent: PGMEA) of the following macromol- After that, the substrate was heated at 200° C. for 1 hour under nitrogen airflow to form the phase separated structure.

Next, the substrate was irradiated with UV by using an ozoneless low pressure mercury lamp (254 nm) (manufactured by SEN LIGHT Co., Ltd.) for 15 minutes. An amount of UV for exposure was 18.0 mJ/cm$^2$.

After that, the substrate was immersed in toluene, or toluene containing 10 mM 3-aminopropyltrimethoxysilane as a developing solution for 60 seconds. When the developing solution containing 3-aminopropyltrimethoxysilane (APTS) was used, the substrate was then immersed in toluene for 20 seconds, air-dried with nitrogen gas, and a heat treatment was conducted at 100° C. for 30 minutes. When the developing solution of toluene only was used, then only air-drying with nitrogen gas was conducted to the substrate. According to that, the nano structure having only a phase of PS on the surface thereof was remained on the substrate.

After that, the substrate on which the nano structure was formed was subjected to dry etching, and the etching rate of the nano structure on the substrate was determined. The $CHF_3$ etching was conducted at 30 sccm, 2 Pa, 70 W, and $Ar/CF_4$ etching was conducted at Ar: 30 sccm, $CF_4$ 5 sccm, 2 Pa, 70 w. The results are shown in Table 3.

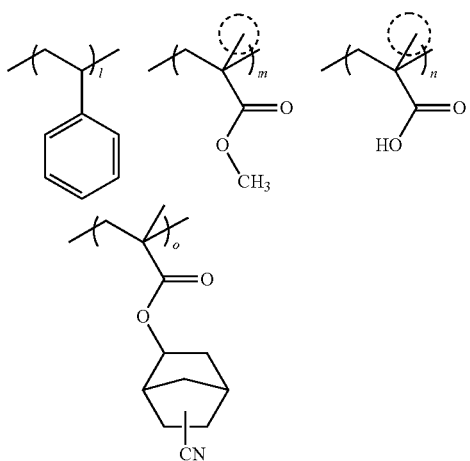

(A)

TABLE 3

| | Metal Alkoxide | Etching Gas | Etching Rate |
| --- | --- | --- | --- |
| Comparative Example 1 | None | $CHF_3$ | 8.7 nm/sec |
| Comparative Example 2 | None | $Ar/CF_4$ | 8.4 nm/sec |
| Example 8 | 10 mM APTS | $CHF_3$ | 0.7 nm/sec |
| Example 9 | 10 mM APTS | $Ar/CF_4$ | 4.4 nm/sec |

With the results described above, it was confirmed that sufficient etching resistance can be given to the nano structure, according to the method of forming a pattern of the present invention.

What is claimed is:

1. A method of forming a fine pattern comprising:
a phase separation step in which a layer containing a block copolymer having a plurality of blocks bonded is formed on a substrate, and then the layer is heated for phase separation thereof;
a decomposition step in which at least a portion of a phase of at least one block of the plurality of blocks constituting the block copolymer in the layer is decomposed;
a selective removal step in which the layer is immersed in a developing solution to selectively remove a phase containing blocks decomposed in the decomposition step to form a nano structure; and
an etching step in which the substrate etched using the nano structure as a mask;
wherein a main component of the developing solution is an organic solvent having an SP value of 7.5 to 11.5 $(cal/cm^3)^{1/2}$, and having a vapor pressure of less than 2.1 kPa at 25° C., or is benzene that may be substituted by an alkyl group, an alkoxy group, or a halogen atom, and wherein the developing solution further contains metal alkoxide.

2. The method of forming a fine pattern according to claim 1, in which the main component of the developing solution contains one or more selected from the group consisting of butyl acetate, 2-heptanone and propylene glycol monomethyl ether acetate.

3. The method of forming a fine pattern according to claim 1, in which the main component of the developing solution contains one or more selected from the group consisting of benzene, toluene, ethyl benzene, xylene, anisole and chlorobenzene.

4. The method of forming a fine pattern according to claim 1, in which the decomposition step is conducted by irradiating the layer with ultraviolet radiation.

5. The method of forming a fine pattern according to claim 4, in which an amount of exposure to ultraviolet radiation at a wavelength of 254 nm is from 1 to 100 $mJ/cm^2$.

6. The method of forming a fine pattern according to claim 1, in which the decomposition step is conducted by irradiating the layer with an ArF excimer laser.

7. The method of forming a fine pattern according to claim 6, in which an amount of exposure to ArF at a wavelength of 193 nm is from 400 to 4000 $mJ/cm^2$.

8. The method of forming a fine pattern according to claim 1, in which the block copolymer comprises polystyrene and polymethyl methacrylate.

9. The method of forming a fine pattern according to claim 8, wherein the layer containing the block copolymer is formed on the substrate by dissolving the block copolymer in toluene or propylene glycol monomethyl ether acetate to obtain a block copolymer solution, and applying the block copolymer solution to the substrate.

10. The method of forming a fine pattern according to claim 9, wherein the main component of the developing solution contains butyl acetate, 2-heptanone propylene glycol monomethyl ether acetate, toluene or benzene.

11. The method of forming a fine pattern according to claim 1, wherein a main component of the developing solution is an organic solvent having an SP value of 8.0 to 10.5 $(cal/cm^3)^{1/2}$ and having a vapor pressure of less than 2.1 kPa at 25° C.

12. The method of forming a fine pattern according to claim 1, wherein a main component of the developing solution is an organic solvent having an SP value of 8.4 to 9.5 $(cal/cm^3)^{1/2}$ and having a vapor pressure of less than 2.1 kPa at 25° C.

13. The method of forming a fine pattern according to claim 1, wherein the metal alkoxide is silicon alkoxide.

14. The method of forming a fine pattern according to claim 13, wherein the silicon alkoxide is 3-aminopropyltrimethoxysilane.

15. The method of forming a fine pattern according to claim 1, wherein in the selective removal step, the layer is immersed in a developing solution to selectively remove a phase containing blocks decomposed in the decomposition step to form a nanostructure, followed by a heat treatment.

16. The method of forming a fine pattern according to claim 15, wherein the heat treatment is conducted at 150 to 40° C. for 10 to 120 seconds.

* * * * *